United States Patent
Remaklus, Jr. et al.

(10) Patent No.: US 7,184,350 B2
(45) Date of Patent: Feb. 27, 2007

(54) METHOD AND SYSTEM FOR PROVIDING INDEPENDENT BANK REFRESH FOR VOLATILE MEMORIES

(75) Inventors: Perry Willmann Remaklus, Jr., Raleigh, NC (US); Robert Michael Walker, Raleigh, NC (US)

(73) Assignee: Qualcomm Incorporated, San Diego, CA (US)

( * ) Notice: Subject to any disclaimer, the term of this patent is extended or adjusted under 35 U.S.C. 154(b) by 161 days.

(21) Appl. No.: 10/982,691

(22) Filed: Nov. 5, 2004

(65) Prior Publication Data

US 2005/0265104 A1 Dec. 1, 2005

Related U.S. Application Data

(60) Provisional application No. 60/575,333, filed on May 27, 2004.

(51) Int. Cl.
*G11C 7/00* (2006.01)
(52) U.S. Cl. .................... 365/222; 365/230.03
(58) Field of Classification Search ............... 365/222, 365/230.03
See application file for complete search history.

(56) References Cited

U.S. PATENT DOCUMENTS

| | | | | |
|---|---|---|---|---|
| 5,796,669 | A * | 8/1998 | Araki et al. ................ | 365/222 |
| 5,999,472 | A * | 12/1999 | Sakurai ...................... | 365/222 |
| 6,310,814 | B1 | 10/2001 | Hampel et al. | |
| 6,529,433 | B2 * | 3/2003 | Choi ........................... | 365/222 |
| 2005/0243627 | A1 * | 11/2005 | Lee et al. .................. | 365/222 |

FOREIGN PATENT DOCUMENTS

WO 9702652 2/1995

\* cited by examiner

*Primary Examiner*—Anh Phung
(74) *Attorney, Agent, or Firm*—Nicholas J. Pauley; Thomas Rouse

(57) ABSTRACT

A memory system is provided. The memory system includes a volatile memory having a number of banks, each bank having a number of rows, and a memory controller configured to direct the volatile memory to engage in an auto-refresh mode, the memory controller further configured to provide a target bank address to the volatile memory. The volatile memory is configured to perform an auto-refresh operation in the auto-refresh mode, the auto-refresh operation being performed on a target bank identified by the target bank address. Remaining banks in the plurality of banks other than the target bank are available for memory access while the auto-refresh operation is being performed on the target bank.

29 Claims, 2 Drawing Sheets

METHOD AND SYSTEM FOR PROVIDING INDEPENDENT BANK REFRESH FOR VOLATILE MEMORIES

RELATED APPLICATIONS

This application claims priority to U.S. Provisional Application No. 60/575,333 filed May 27, 2004.

BACKGROUND

1. Field

The present disclosure relates generally to memory devices, and more specifically, to methods and systems for providing independent bank refresh for volatile memories.

2. Background

Volatile memory is a storage medium that is generally structured as a number of arrays (or banks). Each bank is further arranged as a matrix of "memory cells" in rows and columns, with each column being further divided by the input/output (I/O) width of the memory. Locations within the memory are uniquely specified by bank, row and column. A memory controller may be used to retrieve data from the memory by indicating the data's bank, row and column location. For example, for a quad-bank 128 Mb memory with a 16-bit external data bus, a possible logical address mapping includes a 9-bit column address, a 2-bit bank address and a 12-bit row address.

Prior to reading or writing a memory location, the corresponding row must first be opened. The process of opening a row requires a minimum number of clock cycles, $t_{RCD}$, which represents the row-to-column delay. Once a row is open, column addresses within that row can be read or written as desired. For some dynamic random access memories (DRAMs), such as synchronous DRAMs (SDRAMs), only one row per bank can be kept open at any one time; a subsequent memory access to be performed within the same bank but at a different row requires closing the current row and opening the new one.

In the case of dynamic volatile memories, each cell must be refreshed, or re-energized, periodically at an average interval, $t_{REFI}$, in order to maintain data integrity. The cells have to be refreshed because they are designed around capacitors that store electrical charges, which may discharge over time. Refresh is the process of recharging, or re-energizing, the cells in memory. Cells are generally refreshed one row at a time. A number of methods currently exist that are designed to refresh volatile memories. Some, if not all, of these methods incur high cost in performance and/or power. For example, there are two common methods or techniques that are generally used to control the refresh of volatile memories in modem digital systems. One method relies on the memory to keep track of the row and bank(s) that need to be refreshed using built-in refresh mechanisms that are available on the memory; the other method relies on the memory controller to keep track of the row and bank that need to be refreshed.

The first commonly used method is utilized by the auto-refresh and self-refresh functions of the volatile memories. These functions use the built-in refresh address of the memory. During active use of the memory, if a refresh cycle is required, the memory controller precharges all the banks, and then uses the auto-refresh command to tell the memory to issue an internal refresh cycle. Upon receiving the auto-refresh command, the memory increments the internal refresh address counter and executes the internal refresh cycle. In auto-refresh mode, the memory uses the refresh address in its internal refresh address counter to determine which rows/banks to perform the refresh cycle and cycle through the relevant rows. In one implementation, the internal refresh address counter includes a row address register and a bank address register. The internal refresh address counter is controlled by a refresh clock. The bank address register is incremented to cycle through each of the memory banks with the carry-out of the bank address register causing the row address register to increment. Other implementations do not have a bank address register as all banks are simultaneously refreshed.

A disadvantage of present non-simultaneous bank auto-refresh implementations is that because the memory controller does not know which internal bank will be refreshed, the memory controller is required to close all open rows prior to issuing an auto-refresh command. As a result, the memory data bus availability during an auto-refresh sequence is zero. At best, this sequence requires $t_{RP}+t_{RFC}+t_{RCD}$ cycles, where $t_{RP}$ represents a row-precharge delay, $t_{RFC}$ represents refresh cycle time and $t_{RCD}$ represents the row-to-column delay. For a 133 MHz memory, this could be 16 clock cycles (120 ns). These cycles are sometimes referred to as dead cycles since the memory data bus is not available during this period.

During periods of non-use, the memory controller may place the memory in the self-refresh mode. In the self-refresh mode, the memory uses its own internal clock and refresh address counter to generate refreshes to refresh the row(s) of the memory. This method is good for saving power during idle states since the self-refresh mode can be used. The self-refresh state uses a small amount of power and maintains the contents of the memory by refreshing the memory. Due to the small amount of power needed, this method is typically used for low power applications.

A second method is sometimes used to avoid the dead cycles on the memory data bus mentioned above. According to this second method, control of the refresh is effected via the memory controller. This method does not use any of the built-in refresh mechanisms that are available on the memory. Under this method, at regularly given intervals ($t_{REFI}$), the memory controller explicitly generates refreshes by opening and closing rows in a sequential manner using bank/row address combinations. The refresh clock, which determines the refresh rate, and the bank/row address combinations are internal to the memory controller. This method is best for high speed/high performance applications. This method allows the memory controller to refresh a particular memory bank while permitting other memory banks to remain open for access, resulting in higher performance; reads and writes to other banks can generally continue in parallel and uninterrupted. The downside to this method is that during system power down or long idle states, when the memory controller is not refreshing the memory, the memory cannot be kept in a self-refresh state. As mentioned above, the self-refresh state is a built-in function of most volatile memories. Since the self-refresh function of the memory increments a refresh address (i.e., the row/bank address) stored in a refresh address counter in the memory, independent of the memory controller, the refresh address maintained by the memory cannot be used because it is not consistent or synchronized with the memory controller.

Refresh operations can reduce performance of memory subsystems because each refresh cycle forces the memory into an idle state, during which data access is not available. For example, if a refresh cycle is required for a particular memory bank while such bank is in an active state, the bank has to be shut down to allow the refresh operation to take place. Shutting down the bank means that whatever data operations that were to be performed have to be delayed, hence, affecting system performance.

Some existing schemes are available to reduce the performance impact of refresh operations. Such schemes typically involve using a higher than required refresh rate, so that more memory banks can be refreshed within a predetermined refresh period. By having more memory banks refreshed, the chances of having to shut down an active memory bank for refresh are reduced. Using a higher refresh rate, however, has its drawbacks. For example, an increase in refresh rate means more power is needed which, in turn, results in lower performance. Also, merely using a higher refresh rate does not always obviate the need to shut down an active memory bank when refresh is required; in some situations, an active memory bank has to be shut down regardless, thus, negating any benefits from using a higher refresh rate.

Hence, it would be desirable to provide more efficient methods and systems for providing independent bank refresh for volatile memories.

SUMMARY

In one aspect of the present invention, a memory system includes a volatile memory having a plurality of banks, each bank having a plurality of rows, and a memory controller configured to direct the volatile memory to engage in an auto-refresh mode, the memory controller further configured to provide a target bank address to the volatile memory, wherein the volatile memory is configured to perform an auto-refresh operation in the auto-refresh mode, the auto-refresh operation being performed on a target bank identified by the target bank address, and wherein remaining banks in the plurality of banks other than the target bank are available for memory access while the auto-refresh operation is being performed on the target bank.

In another aspect of the present invention, a memory system includes a volatile memory having a bank address latch, a plurality of banks, a plurality of refresh row counters, each refresh row counter associated with a corresponding bank and configured to store a target row address, and a memory controller configured to direct the volatile memory to engage in an auto-refresh mode, the memory controller further configured to load a target bank address into the bank address latch, wherein the volatile memory is configured to perform an auto-refresh operation in the auto-refresh mode, the auto-refresh operation being performed on a target bank identified by the target bank address using the target row address stored in the refresh row counter associated with the target bank.

In yet another aspect of the present invention, a memory system includes a volatile memory having a plurality of banks, latching means for storing a target bank address, counter means for maintaining a target row address for each corresponding bank, and controller means for directing the volatile memory to engage in an auto-refresh mode and load the target bank address into the latching means, wherein the volatile memory is configured to retrieve the target bank address from the latching means and perform an auto-refresh operation in the auto-refresh mode, the auto-refresh operation being performed on a target bank identified by the target bank address using the target row address for the target bank.

In a further aspect of the present invention, a method for providing memory refresh for a volatile memory having a plurality of banks, includes: maintaining a target row address for each of the plurality of banks, wherein the target row addresses for the plurality of banks are independent of each other; loading a target bank address, and directing the volatile memory to enter into an auto-refresh mode and perform an auto-refresh operation on a target bank identified by the target bank address using the target row address corresponding to the target bank.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

Figure 1:
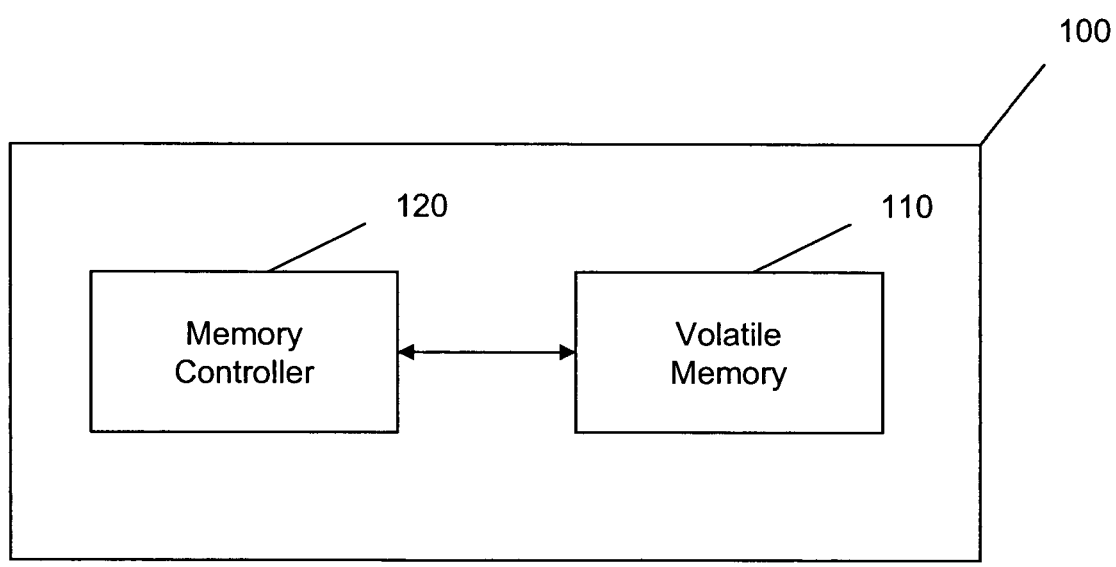
FIG. 1 is a simplified block diagram illustrating an arrangement that can be used to practice the independent refresh method according to the present disclosure.

Various embodiments of a memory system will now be described. In one embodiment, an independent refresh method is provided which improves data availability in a memory during refresh operations. FIG. 1 shows an arrangement 100 that can be used to practice the independent refresh method. As shown in FIG. 1, the independent refresh method may be practiced with a volatile memory 110 and a controller 120 configured to control the volatile memory. The volatile memory 110 can be, for example, a DRAM (dynamic random access memory), a SDRAM (synchronous DRAM), and various other types of DRAM, etc. Based on the disclosure and teachings provided herein, a person of ordinary skill in the art will appreciate how to practice the present disclosure with other types of memories which require refresh operations. In one implementation, the independent refresh method is effected via control logic or a processor which controls the memory controller 120 and the volatile memory 110. It should be understood that the control logic or processor may be implemented as an independent module or integrated as part of another component, such as, the memory controller 120.

Figure 2:
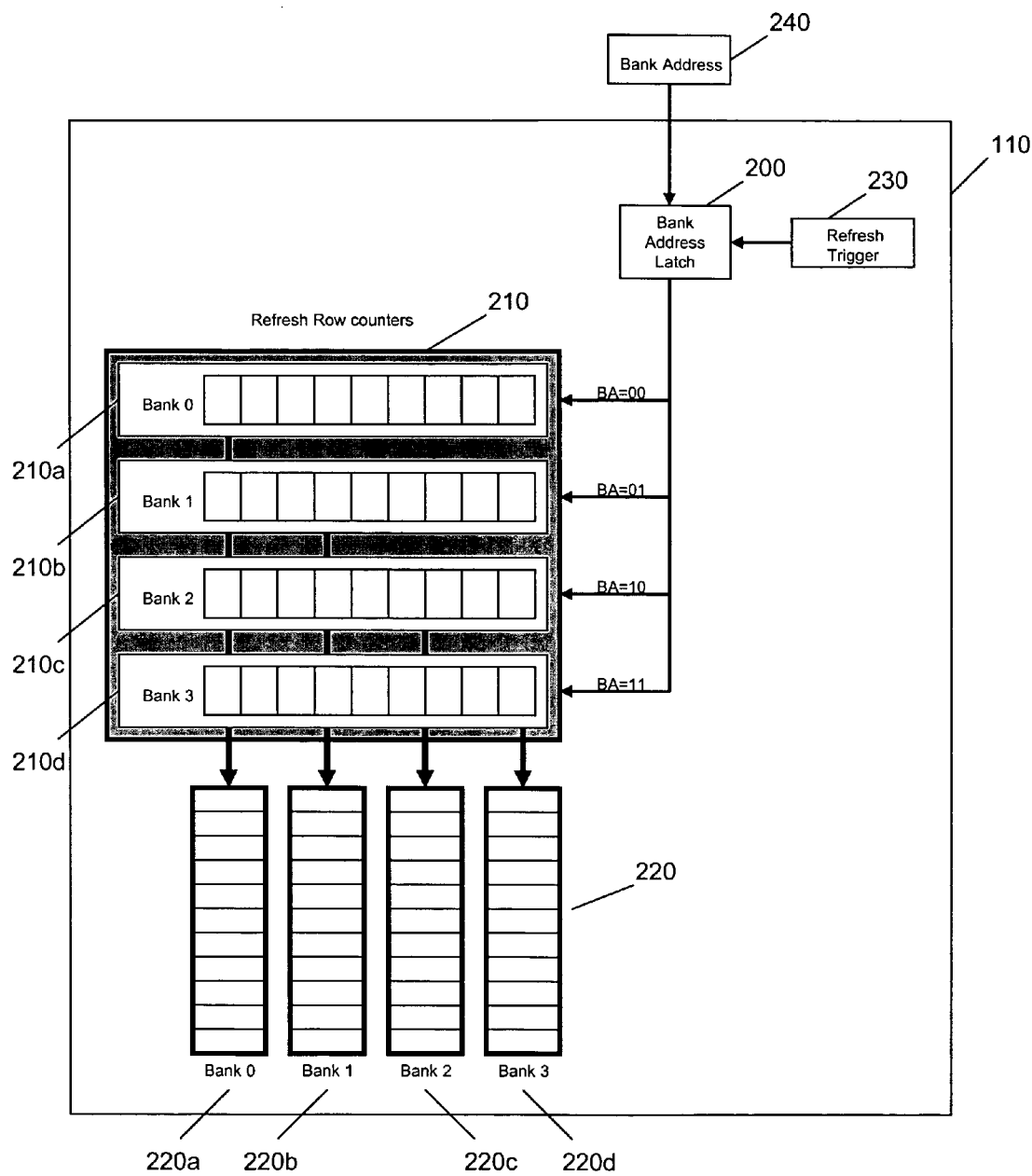
FIG. 2 is a simplified block diagram illustrating a volatile memory that can be used to practice the independent refresh method according to the present disclosure.

FIG. 2 further shows one embodiment of the volatile memory 110 that can be used to practice the independent refresh method. The volatile memory 110 may further include a bank address latch 200, a refresh trigger 230, a number of refresh row counters 210a–d and a number of banks 220a–d. The bank address latch 200 is used to store the target bank address for the specific bank that is to be refreshed. The banks 220a–d are each associated with their corresponding refresh row counters 210a–d. The initial values for the refresh row counters 210a–d are initialized upon power-up or reset. For example, the refresh row counter 210a is associated with the bank 220a. The refresh row counters 210a–d are used to maintain target row addresses for rows that are to be refreshed in the respective banks 220a–d. The target row addresses stored in the refresh row counters 210a–d are independent of each other. The refresh trigger 230 is used to control the bank address latch 200 during self-refresh mode, as will be further described below. The refresh trigger 230 can be, for example, a clock or other timing mechanisms.

The memory controller 120 (see FIG. 1) can direct the volatile memory 110 to enter into auto-refresh mode and auto-refresh a specific bank, e.g., the bank 220a, within the volatile memory 110 while other banks (such as, banks 220b–d) remain available for access. To initiate an auto-refresh cycle, the memory controller 120 (see FIG. 1) issues an auto-refresh command to the volatile memory 110 and loads the bank address 240 into the bank address latch 200. The bank address 240 is used to identify one of the banks 220a–d that is targeted for refresh. The bank address 240 is also used to identify the corresponding refresh row counter associated with the bank to be refreshed. Hence, with the bank address stored in the bank address latch 200 and the target row address stored in the corresponding refresh row counter, a specific row in a specific bank can be identified for refresh. After the refresh operation is performed, the refresh row counter associated with the bank that has just been refreshed is incremented by control logic (not shown). Because the memory controller 120 is aware of the specific bank to be refreshed, access to the other banks can continue without interruption. This maximizes the memory data bus utilization, reduces power consumption by avoiding unnecessary row close/open sequences, and serves to minimize transfer latency.

In addition, because the banks 220a–d have their own refresh row counters 210a–d, the memory controller 120 has the flexibility to post independent refreshes to a specific bank. In other words, the banks 220a–d can be refreshed independent of each other. For example, in one instance, the memory controller 120 may issue auto-refresh command(s) to the volatile memory 110 to auto-refresh the bank 220a. One or more rows in the bank 220a are then refreshed beginning with the target row address stored in the refresh row counter 210a associated with the bank 220a. In another instance, the memory controller 120 may issue auto-refresh command(s) to the volatile memory 110 to auto-refresh a different bank, bank 220c. One or more rows in the bank 220c are then refreshed beginning with the target row address stored in the refresh row counter 210c associated with the bank 220c. It should be noted that the target row addresses stored in the refresh row counters 210a and 210c respectively can be the same or different.

By allowing each bank to be refreshed independently, the memory controller 120 is able to utilize those time periods when a given bank is idle to issue auto-refresh command(s) to the volatile memory 110 so that advanced refresh(es) can be performed on the idle bank ahead of schedule before they are due. Consequently, the availability of the banks 220a–d is increased since scheduled refresh(es) are performed less frequently when the banks 220a–d are active. In one example, if the bank 220a is idle for an extended period, additional advanced refresh(es) can be performed on the bank 220a; subsequently, scheduled refresh(es) for the bank 220a can be skipped while the bank 220a is active. In another example, if the bank 220b is idle for a shorter period, the memory controller 120 may choose to initiate fewer advanced refresh(es).

Having the ability to refresh ahead of schedule allows the banks 220a–d to operate more efficiently during periods of high data traffic. For example, if a given bank is n refreshes ahead of schedule, the memory controller 120 can avoid the overhead of issuing n regularly scheduled refreshes to that bank but can instead continue to carry out memory access operations. This maximizes memory data bus utilization, reduces power consumption by avoiding unnecessary row close/open sequences, and serves to minimize transfer latency.

Furthermore, the memory controller 120 may direct the volatile memory 110 to enter into self-refresh mode. When entering the self-refresh mode, the volatile memory 110 begins with the most recent bank address stored in the bank address latch 200. The most recent bank address is generally the bank address used in the latest auto-refresh operation. By using the bank address currently stored in the bank address latch 200, the volatile memory 110 is able to pick up where the memory controller 120 left off after the last auto-refresh operation.

During each self-refresh operation, a target bank to be refreshed is identified by the bank address currently stored in the bank address latch 200. A specific row in the target bank that is to be refreshed is further identified by the target row address currently stored in the refresh row counter associated with the target bank. Hence, a refresh operation can be performed on the specific row in the target bank.

Furthermore, during each self-refresh operation, the bank address latch 200 is incremented by the refresh trigger 230. By incrementing the bank address latch 200, the bank address is updated to identify the next target bank to be refreshed. In addition, the refresh row counter associated with the bank that has just been refreshed is also incremented by control logic (not shown) to provide an updated target row address for that bank; the updated target row address will be used next time that bank is to be refreshed.

The next self-refresh operation is then performed using the updated bank address in the bank address latch 200 and the corresponding refresh row counter associated with the bank identified by the updated bank address.

As a result, when the volatile memory 110 enters the self-refresh mode, the banks 220a–d are cycled through using their corresponding refresh row counters 210a–d.

Alternatively, when the volatile memory 110 enters self-refresh mode, all the banks 220a–d can be refreshed concurrently using the target row addresses stored respectively in the corresponding refresh row counters 210a–d. The concurrent refresh of all the banks 220a–d and related operations of the refresh row counters 210a–d can be achieved via control logic (not shown). Based on the disclosure and teaching provided herein, a person of ordinary skill in the art will appreciate how to effect the concurrent refresh in accordance with the concepts disclosed in the present disclosure.

The methods or algorithms described in connection with the embodiments disclosed herein may be embodied directly in hardware, in a software module executable by a processor, or in a combination of both, in the form of control logic, programming instructions, or other directions. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

What is claimed is:

1. A memory system comprising:
a volatile memory having a plurality of banks, each bank having a plurality of rows; and
a memory controller configured to direct the volatile memory to engage in an auto-refresh mode, the memory controller further configured to provide a target bank address to the volatile memory;
wherein the volatile memory is configured to perform an auto-refresh operation in the auto-refresh mode, the auto-refresh operation being performed on a target bank identified by the target bank address; and
wherein remaining banks in the plurality of banks other than the target bank are available for memory access while the auto-refresh operation is being performed on the target bank.

2. The system of claim 1 wherein the volatile memory further comprises a plurality of refresh row counters, each refresh row counter associated with a corresponding bank and configured to maintain a target row address; and
wherein the volatile memory is further configured to perform the auto-refresh operation on the target bank using the target row address stored in the refresh row counter associated with the target bank.

3. The system of claim 2 wherein the target row addresses stored respectively in the plurality of refresh row counters are independent of each other.

4. The system of claim 2 wherein the memory controller is further configured to direct the volatile memory to engage in a self-refresh mode;
wherein the volatile memory is further configured to cycle through the plurality of banks in the self-refresh mode by incrementing the target bank address to generate the current target bank address; and
wherein during each self-refresh operation, the volatile memory is further configured to refresh the bank identified by the current target bank address based on the target row address stored in the associated refresh row counter.

5. The system of claim 1 wherein the volatile memory is further configured to perform one or more additional auto-refresh operations on the target bank in the auto-refresh mode to generate one or more advanced refreshes for the target bank if the target bank is idle.

6. The system of claim 5 wherein the volatile memory is further configured to avoid performing a regularly scheduled refresh if one or more advanced refreshes have been performed and continue its normal operations.

7. The system of claim 1 wherein the volatile memory is one of a dynamic random access memory (DRAM) or a synchronous DRAM.

8. A memory system comprising:
a volatile memory having a bank address latch, a plurality of banks, a plurality of refresh row counters, each refresh row counter associated with a corresponding bank and configured to store a target row address; and
a memory controller configured to direct the volatile memory to engage in an auto-refresh mode, the memory controller further configured to load a target bank address into the bank address latch;
wherein the volatile memory is configured to perform an auto-refresh operation in the auto-refresh mode, the auto-refresh operation being performed on a target bank identified by the target bank address using the target row address stored in the refresh row counter associated with the target bank.

9. The system of claim 8 wherein remaining banks in the plurality of banks other than the target bank are available for memory access while the auto-refresh operation is being performed on the target bank.

10. The system of claim 8 wherein the target row addresses stored respectively in the plurality of refresh row counters are independent of each other.

11. The system of claim 8 wherein the memory controller is further configured to direct the volatile memory to engage in a self-refresh mode;
wherein the volatile memory is further configured to cycle through the plurality of banks in the self-refresh mode by incrementing the bank address latch to generate the current target bank address; and
wherein during each self-refresh operation, the volatile memory is further configured to refresh the bank identified by the current target bank address based on the target row address stored in the associated refresh row counter.

12. The system of claim 8 wherein the volatile memory is further configured to perform one or more additional auto-refresh operations on the target bank in the auto-refresh mode to generate one or more advanced refreshes for the target bank if the target bank is idle.

13. The system of claim 12 wherein the volatile memory is further configured to avoid performing a regularly scheduled refresh if one or more advanced refreshes have been performed and continue its normal operations.

14. The system of claim 11 wherein upon the volatile memory entering into the self-refresh mode, the target bank address stored in the bank address latch represents the last bank address used in the last auto-refresh operation.

15. The system of claim 8 wherein the volatile memory is one of a dynamic random access memory (DRAM) or a synchronous DRAM.

16. A memory system comprising:
a volatile memory having a plurality of banks;
latching means for storing a target bank address;
counter means for maintaining a target row address for each corresponding bank; and
controller means for directing the volatile memory to engage in an auto-refresh mode and loading the target bank address into the latching means;
wherein the volatile memory is configured to retrieve the target bank address from the latching means and perform an auto-refresh operation in the auto-refresh mode, the auto-refresh operation being performed on a target bank identified by the target bank address using the target row address for the target bank.

17. The system of claim 16 wherein remaining banks in the plurality of banks other than the target bank are available for memory access while the auto-refresh operation is being performed on the target bank.

18. The system of claim 16 wherein the target row addresses for the plurality of banks maintained by the counter means are independent of each other.

19. The system of claim 16 wherein the controller means is further used for directing the volatile memory to engage in a self-refresh mode;
wherein the volatile memory is further configured to cycle through the plurality of banks in the self-refresh mode by incrementing the latching means to generate the current target bank address; and
wherein during each self-refresh operation, the volatile memory is further configured to refresh the bank identified by the current target bank address based on the target row address for that bank.

20. The system of claim 16 wherein the volatile memory is further configured to perform one or more additional auto-refresh operations on the target bank in the auto-refresh mode to generate one or more advanced refreshes for the target bank if the target bank is idle.

21. The system of claim 20 wherein the volatile memory is further configured to avoid performing a regularly scheduled refresh if one or more advanced refreshes have been performed and continue its normal operations.

22. The system of claim 19 wherein upon the volatile memory entering into the self-refresh mode, the target bank address stored in the latching means represents the last bank address used in the last auto-refresh operation.

23. The system of claim 16 wherein the volatile memory is one of a dynamic random access memory (DRAM) or a synchronous DRAM.

24. A method for providing memory refresh for a volatile memory having a plurality of banks, comprising:
maintaining a target row address for each of the plurality of banks, wherein the target row addresses for the plurality of banks are independent of each other;
loading a target bank address; and
directing the volatile memory to enter into an auto-refresh mode and perform an auto-refresh operation on a target bank identified by the target bank address using the target row address corresponding to the target bank.

25. The method of claim 24 wherein remaining banks in the plurality of banks other than the target bank are available for memory access while the auto-refresh operation is being performed on the target bank.

26. The method of claim 24 further comprising:
directing the volatile memory to engage in a self-refresh mode; and
cycling through the plurality of banks in the self-refresh mode by incrementing the target bank address and performing a refresh on the bank identified by the target bank address based on the target row address corresponding to the identified bank during each self-refresh operation.

27. The method of claim 24 further comprising:
performing one or more additional auto-refresh operations on the target bank in the auto-refresh mode to generate one or more advanced refreshes for the target bank if the target bank is idle.

28. The method of claim 27 further comprising:
avoiding execution of a regularly scheduled refresh if one or more advanced refreshes have been performed and continuing normal operation of the volatile memory.

29. The method of claim 24 wherein the volatile memory is one of a dynamic random access memory (DRAM) or a synchronous DRAM.

* * * * *